United States Patent [19]

Tummers

[11] 3,753,802

[45] Aug. 21, 1973

[54] TRANSISTOR

[75] Inventor: Leonard Johan Tummers, Emmasingel, Eindhoven, Netherlands

[73] Assignee: North American Philips Co., Inc., New York, N.Y.

[22] Filed: Mar. 5, 1964

[21] Appl. No.: 349,709

Related U.S. Application Data

[62] Division of Ser. No. 84,923, Jan. 25, 1961, Pat. No. 3,217,214.

[30] Foreign Application Priority Data

Jan. 29, 1960 Netherlands ........................ 247,902

[52] U.S. Cl. ..................... 148/174, 148/175, 29/580

[51] Int. Cl. .............................................. H01l 7/36

[58] Field of Search ........................ 148/1.5, 1.6, 33, 148/174, 175; 317/234, 235; 29/25.3, 25.3 D, 25.3 GR, 155.5 G

[56] References Cited

UNITED STATES PATENTS

| | | | |
|---|---|---|---|
| 3,006,791 | 10/1961 | Webster | 317/235 |
| 3,087,100 | 4/1963 | Savadelis | 317/235 |
| 3,141,119 | 7/1964 | Phillips | 317/235 |
| 3,165,811 | 1/1965 | Kleimack et al. | 317/235 |

*Primary Examiner*—Charles W. Lanham
*Assistant Examiner*—Tupman
*Attorney*—Frank R. Trifari

[57] ABSTRACT

A method of making a transistor by forming a layer of high resistivity on a semiconductor collector body, diffusing a base zone into the layer to a depth less than the thickness of the layer and then forming an emitter zone in the base zone.

4 Claims, 4 Drawing Figures

TRANSISTOR

Figure 1:
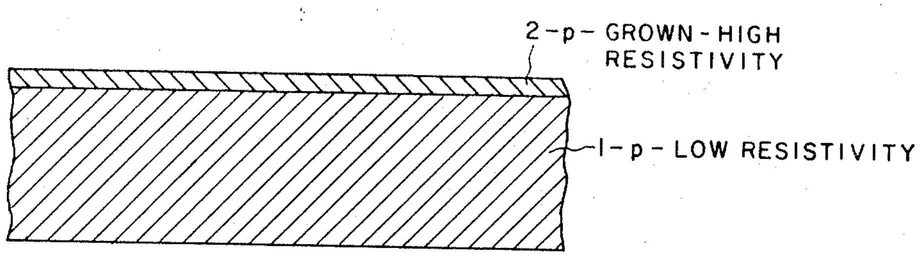

This application is a division of my copending application, Ser. No. 84,923, filed Jan. 25, 1961 now U.S. Pat. No. 3,217,214.

This invention relates to a transistor, particularly intended for switching purposes, which transistor consists of a disc of semiconductive material, of which one of two opposite main surfaces is provided with a collector contact, in which material a collector-base junction prevails.

One of the restrictions inherent in switching currents by means of such transistors with respect to the reduction of the switching periods consists, in a frequently used arrangement, in that the change-over from one switch condition to another is delayed by transition phenomena. In the "on" condition, the "on"condition currents flow through the junction between the base and the collector in the forward direction, which results in a strong injection of charge carriers into the semiconductive collector material. Before the opposite switching condition, the "off" condition, can be attained, these charge carriers have to be removed.

With crystal diodes, which may exhibit the same effect, it is known to suppress this effect by using semiconductor material having one or more active impurities reducing the lifetime of the charge carriers, to which end particularly iron, nickel, copper and gold are used in the case of germanium. A similar use of this measure with transistors is, however, not possible without the need for further means since the amplification factor of a transistor usually decreases with a reduction of the lifetime of the charge carriers in the semiconductor material. A further disadvantage inherent in the said measure consists in that the collector leakage current increases.

The invention is based on the idea that it is possible to construct a disc or wafer of semiconductor material from two parts consisting of materials of different properties, while in one of them a short lifetime of the charge carriers can be attained without the collector leakage current attaining inadmissible values.

In accordance with a feature of the invention, the disc of semiconductor material is built up from two layers of different materials, of which the relative boundary substantially coincides with the collector-base junction, the layer adjacent the collector contact, i.e., the collector layer, having a shorter lifetime for charge carriers than the other layer, the base layer, while the band gap or interval of the material in the collector layer exceeds that of the material of the base layer.

It should be noted that the terms "collector layer" and "base layer" serve to distingush semiconductor parts of different lifetimes and band intervals and are not to be mixed up with the terms "emitter zone," "base zone" and "collector zone," which indicate semiconductor parts of different conductivity type.

The term "the boundary between the collector layer and the base layer substantially coincides with the collector-base junction" is to be understood to mean herein that the said boundary coincides with the junction or that it is located at the side of the junction near the collector contact at a distance which is at the most equal to the diffusion length of the charge carriers in the base layer, this distance being preferably smaller than the thickness of the base zone. When this condition is fulfilled, a lower collector leakage current will be obtained owing to the difference in band intervals.

As stated above, this lower collector leakage current provides the possibiltity of reducing the lifetime of the charge carriers. The base layer may, for example, be made from germanium having a band interval or forbidden gap of 0.72 eV and the collector layer may be made, for example, from silicon having a band interval of 1.12 eV or from a semiconductive compound, for example, gallium arsenide (GaAs; 1.35 eV), gallium phosphide (GaP; 2.25 eV) indium phosphide (InP; 1.25 eV) or aluminum antimonide (AlSb; 1.52 eV). A method to be used preferably in accordance with the invention for the manufacture of such a transistor consists in that the base layer is caused to grow on the collector layer; it may be applied to the collector layer, for example, by vaporization.

The invention will now be described more fully with reference to one embodiment which is illustrated in the drawing.

FIGS. 1–4 show diagrammatically sections of a transistor in various stages of the manufacture on an enlarged scale, particularly thin layers and zones are shown on an exaggerated scale.

The starting product is a plate of silicon 1 of p-type, having a thickness of 50$\mu$, a low resistivity of 0.001 ohm-cm and a lifetime for charge carriers of $10^{-9}$ sec, which material may form the collector layer. The lifetime of this material may be degraded by addition of killers such as gold to a content of $10^{16}$ at./cm$^3$ and/or by a suitable quenching of the material from about 1,000°C to room temperature.

In known manner, not essential to the invention, a layer of germanium 2 of 3$\mu$ in thickness is applied to this plate by vaporization; this layer, which also has p-conductivity owing to doping with indium, has a high resistivity of 2 ohm-cm. The lifetime of the charge carriers amounts to 0.1$\mu$sec.

Figure 2:
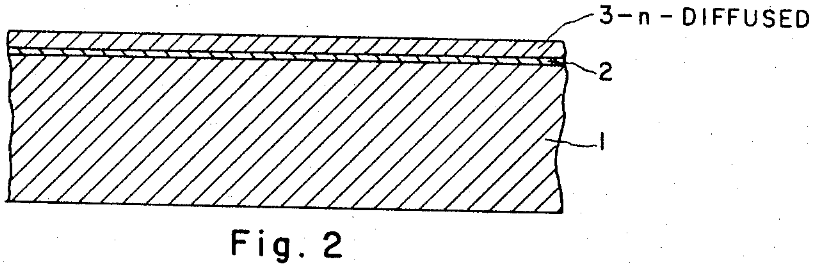
Figure 3:
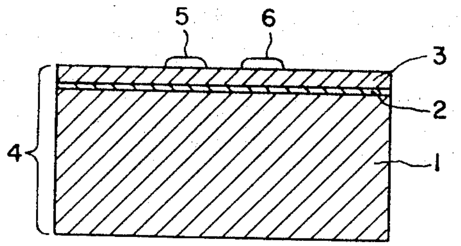

Then the plate is converted superficially by a diffusion treatment in antimony vapour (pressure $10^{-4}$ mm Hg) for 4 hours at 600°C to a depth of 2$\mu$ into n-type material. The resultant n-type surface layer 3 is then removed by etching from the lower side of the plate. The result is illustrated in FIG. 2. From this plate, discs 4 (FIG. 3) of 2 × 2 mm are cut from this plate, on which discs the transistors are built up.

To this end, each disc 4 is provided by vaporization with an emitter contact 5 of 150 × 25$\mu$ of aluminum, and a base contact 6 of the same size of gold. The contacts 5 and 6 are located parallel to each other and side by side at a distance of 15$\mu$ (see FIG. 3). During vaporization the germanium is kept at a temperature of 300°C in vacuum.

Figure 4:
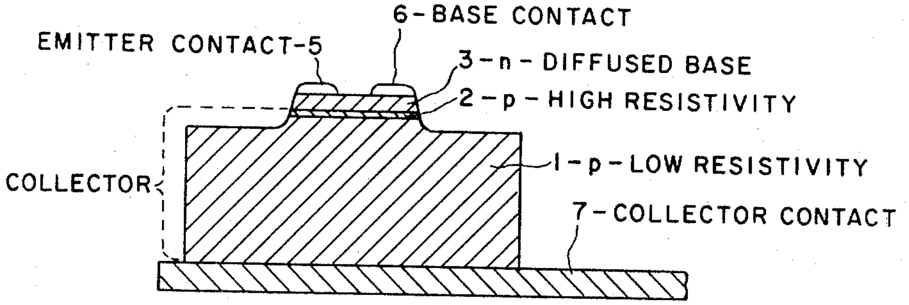

By masking and etching, the semiconductor material surrounding the contacts 5 and 6 is then removed to a depth of 8$\mu$, so that a transistor of the known "mesa"-type is obtained, which finally is fastened by means of tin solder to a nickel collector contact 7 (see FIG. 4).

In the present case, the collector layer is thus formed by the part 1 and the base layer by the parts 2 and 3. The collector-base junction is located between these parts 2 and 3 at a distance of 1$\mu$ from the material of the collector layer. This distance is sufficiently small to obtain a reduction in the leakage current, taking into account that the diffusion length of the electrons in the germanium applied by vaporization is about 20$\mu$.

The emitter zone, which underlies the emitter contact 5, is not shown in the drawing; the base zone is formed by the diffused part 3 and the collector zone by parts 1 and 2.

What is claimed is:

1. A method of making a transistor, comprising providing a substrate of one type conductivity and having a relatively low resistance, growing on a surface portion of the said substrate a layer of semiconductor material of the same one type conductivity but of relatively high resistance, diffusing into the said last-named layer a significant impurity of the opposite-conductivity-forming type to a depth less than the thickness of said high resistance layer forming a zone of the opposite type of conductivity constituting a base region of the transistor, forming an emitter zone in the base zone, and thereafter contacting the base zone, the emitter zone, and the substrate to provide a collector connection.

2. A method of making a transistor, comprising providing a substrate of one type conductivity and having a relatively low resistance, growing on a surface portion of the said substrate a layer of semiconductor material of the same one type conductivity but of relatively high resistance, diffusing into the said last-named layer a significant impurity of the opposite-conductivity-forming type to a depth less than the thickness of said high resistance layer forming a zone of the opposite type of conductivity constituting a base region of the transistor, the undiffused remainder of said layer of high resistance having a thickness less than a diffusion length for charge carriers in the base region, forming an emitter zone in the base zone, and thereafter contacting the base zone, the emitter zone, and the substrate to provide a collector connection.

3. A method of making a transistor, comprising providing a body of semiconductive material having a relatively large forbidden gap between its valence and conduction bands, at least a surface portion of said body being of one conductivity type and of relatively low resistivity, growing on said surface portion of said body a layer of semiconductive material having a relatively small forbidden gap between its valence and conduction bands and of the same said one conductivity type but of relatively high resistivity, diffusing into the said layer a significant impurity forming the opposite type of conductivity to form a zone of the opposite type of conductivity constituting a base region of the transistor, forming within the said base region an emitter zone of said one conductivity type, contacting the emitter zone, contacting the base region, and contacting the said body at a region of said one conductivity type to provide a collector connection.

4. The method of making a junction transistor comprising the steps of forming by vapor deposition on a surface portion of a semiconductive body a layer of higher specific resistivity than the specific resistivity of said surface portion, diffusing into a surface portion of the layer a conductivity-type impurity for forming in said layer a first region of a conductivity type opposite that of said surface portion of said semiconductive body, while leaving a high specific resistivity portion of said layer between said first region and the original surface portion of said body, and introducing into a limited surface portion of the first region a conductivity-type impurity of the type opposite that diffused into the first region for forming within said first region a second region of the opposite conductivity type, the second region serving as the emitter region, the first region serving as the base region, and the semiconductive body including the collector region of the junction transistor.

* * * * *

PO-1050
(5/69)

UNITED STATES PATENT OFFICE
CERTIFICATE OF CORRECTION

Patent No. 3,753,802 Dated August 21, 1973

Inventor(s) LEONARD JOHAN TUMMERS

It is certified that error appears in the above-identified patent and that said Letters Patent are hereby corrected as shown below:

On the cover page, item 73 listing the Assignee should read -- U. S. Philips Corporation, New York, N.Y. --

Signed and sealed this 27th day of November 1973.

(SEAL)
Attest:

EDWARD M.FLETCHER,JR.
Attesting Officer

RENE D. TEGTMEYER
Acting Commissioner of Patents